(12) United States Patent
Nam

(10) Patent No.: US 7,538,343 B2
(45) Date of Patent: May 26, 2009

(54) ORGANIC LIGHT EMITTING DISPLAY (OLED)

(75) Inventor: Wi-Jin Nam, Busan-si (KR)

(73) Assignee: Samsung Mobil Display Co., Ltd., Yongin, Gyunggi-Do (KR)

( * ) Notice: Subject to any disclaimer, the term of this patent is extended or adjusted under 35 U.S.C. 154(b) by 45 days.

(21) Appl. No.: 11/582,370

(22) Filed: Oct. 18, 2006

(65) Prior Publication Data

US 2007/0215870 A1  Sep. 20, 2007

(30) Foreign Application Priority Data

Mar. 14, 2006  (KR) ............... 10-2006-0023692
Mar. 14, 2006  (KR) ............... 10-2006-0023693

(51) Int. Cl.
*H01L 21/00* (2006.01)

(52) U.S. Cl. ............... 257/40; 257/72; 257/79; 257/E23.104; 257/E23.137; 438/82; 438/99; 313/504; 313/506

(58) Field of Classification Search ............ 257/40, 257/103, 72–79; 313/503–506; 438/22, 438/48, 82, 99
See application file for complete search history.

(56) References Cited

U.S. PATENT DOCUMENTS

| | | | |
|---|---|---|---|
| 2001/0050663 A1 | 12/2001 | Park | |
| 2002/0150740 A1* | 10/2002 | Chung | ............... 428/201 |
| 2004/0124768 A1 | 7/2004 | Suzuki | |
| 2005/0098878 A1* | 5/2005 | Yu et al. | ............... 257/706 |
| 2005/0195355 A1* | 9/2005 | Kwak et al. | ............... 349/149 |

FOREIGN PATENT DOCUMENTS

| | | |
|---|---|---|
| CN | 1516526 | 7/2004 |
| JP | 10-232628 | 9/1998 |
| JP | 2003-167523 | 6/2003 |
| JP | 2003-217836 A | 7/2003 |
| KR | 2003-0022470 A | 3/2003 |
| KR | 2003-0083528 A | 10/2003 |
| KR | 2003-0085447 A | 11/2003 |

(Continued)

OTHER PUBLICATIONS

*Office Action* from the State Intellectual Property Office of P.R. China issued on Jun. 20, 2008 corresponding to Chinese Patent Application No. 200710005648.8.

(Continued)

*Primary Examiner*—Dung A. Le
(74) *Attorney, Agent, or Firm*—Robert E. Bushnell, Esq.

(57) ABSTRACT

An Organic Light Emitting Display (OLED) includes: a substrate having defined pixel region and non-pixel regions and including an organic light emitting element arranged in the pixel region; a driver IC arranged in the non-pixel region of the substrate and adapted to supply a signal to the organic light emitting element; a sealant arranged on the non-pixel region of the substrate; a metal cap spaced away from the substrate and affixed with the sealant to a position corresponding to the substrate; a ground wire electrically connecting the driver IC to the metal cap; a conductive paste arranged between the metal cap and the ground wire; and a printed circuit board arranged to correspond to one side of the metal cap.

20 Claims, 3 Drawing Sheets

FOREIGN PATENT DOCUMENTS

| KR | 10-2006-0001378 | 1/2006 |
| KR | 2006-0010354 A | 2/2006 |
| KR | 2006-0067432 A | 6/2006 |

OTHER PUBLICATIONS

*Search Report* from the European Patent Office issued on Nov. 20, 2007 corresponding to European Patent Application No. 07101708.1.

Korean Office Action for Korean Patent Application No. 2006-0023692 issued on Feb. 26, 2007.

*Notice of Allowance* from the Korean Intellectual Property Office issued on Aug. 22, 2007 corresponding to Korean Patent Application No. 10-2006-0023692.

*Notice of Allowance* from the Korean Intellectual Property Office issued on Sep. 7, 2007 corresponding to Korean Patent Application No. 10-2006-0023693.

\* cited by examiner

FIG. 5
FIG. 6
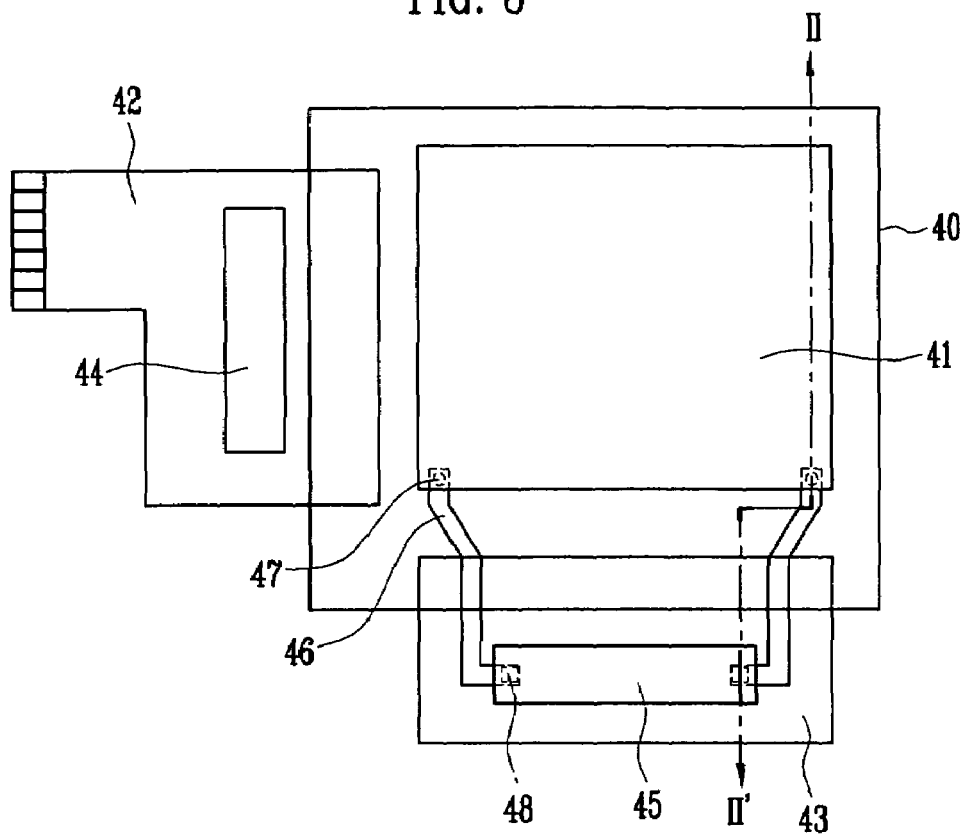
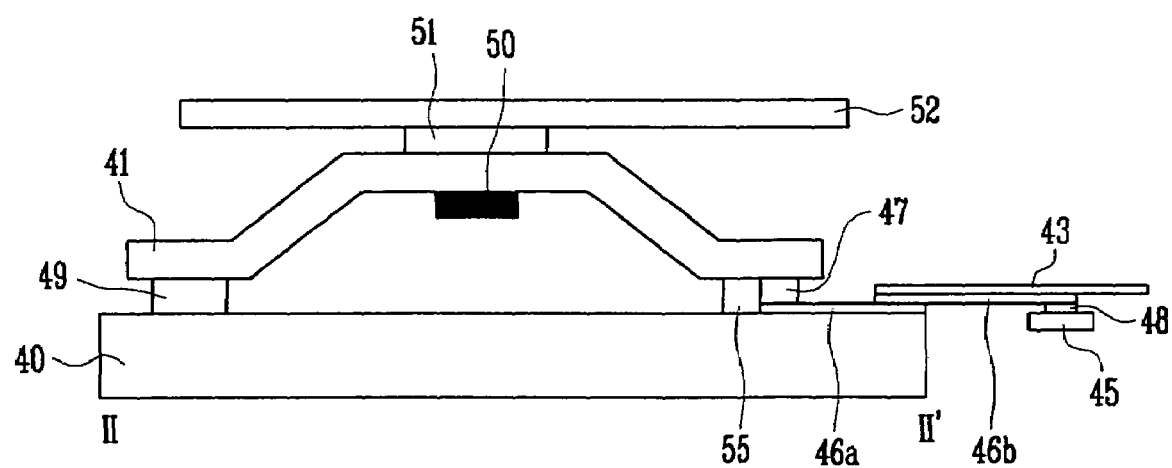

ORGANIC LIGHT EMITTING DISPLAY (OLED)

CLAIM OF PRIORITY

This application makes reference to, incorporates the same herein, and claims all benefits accruing under 35 U.S.C. § 119 from applications for ORGANIC LIGHT EMITTING DISPLAY DEVICE earlier filed in the Korean Intellectual Property Office on 14 Mar. 2006 and there duly assigned Serial No. 10-2006-0023692 and 10-2006-0023693, respectively.

BACKGROUND OF THE INVENTION

1. Field of the Invention

The present invention relates to an Organic Light Emitting Display (OLED), and more particularly to an OLED capable of assuring a reduced module mounting space by reducing the number of input pins of a driver IC 2. Description of the Related Art In general, an organic light emitting element emits light when the combined excitons of electrons and holes fall from an excitation state to a ground state by injecting electrons and holes from an electron injecting electrode (cathode) and a hole injecting electrode (anode) into an emission layer.

With this principle, it has an advantage in that unlike a conventional a thin film Liquid Crystal Display (LCD) element, the organic light emitting element does not require a separate light source and is thus able to reduce its volume and weight.

Also, the organic light emitting element has a excellent characteristics including low power requirements, high brightness, high response speed, and low weight. Due to these characteristics, the OLED is believed to be a next generation display, which will be used for almost all electronic application products, such as mobile communication terminals, CNSs, PDAs, camcoders, palm PCs, etc.

Furthermore, it has an advantage in that the overall production cost of the organic light emitting element can significantly be reduced over that of an existing LCD, since its manufacturing process is simple.

FIG. 1 is a view of an Organic Light Emitting Display (OLED) according to a Chip On Glass (COG) structure of the related art and FIG. 2 is a view of an Organic Light Emitting Display (OLED) according to a Tape Carrier Package (TCP) structure of the related art.

Referring to FIG. 1, the OLED having a COG structure according to the related art includes an organic light emitting element that is formed in a pixel region 11 on a substrate 10 having defined pixel and non-pixel regions, and a driver IC 12 formed in the non-pixel region to supply a signal to the organic light emitting element. The driver IC 12 is formed with a plurality of input pins including a ground input pin 13.

When the driver IC 12 is mounted on the substrate as shown in FIG. 1, if the number of the input pins of the driver IC 12 is large, its size is increased and therefore, the mounting area of the substrate must be wide.

The OLED having a TCP structure as shown in FIG. 2 includes an organic light emitting element formed in a pixel region 21 on a substrate 20 having defined pixel and non-pixel regions, and a Tape Carrier Package (TCP) 22 and a driver IC 23 that are formed in the non-pixel region. The TCP 22 has a signal wire for connection to a printed circuit board (not shown) and the organic light emitting element and the driver IC 23 to supply a signal to the organic light emitting element. The driver IC 23 is formed with a plurality of input pins including a ground input pin 24.

When the driver IC 23 is mounted on the printed circuit board as shown in FIG. 2, if the number of the input pins of the driver IC 23 is large, the space for mounting it must be wide.

As a result, in desiring a compact display device, such OLEDs are disadvantageous in that their size becomes large and their appearance poor, since the area for mounting the driver IC and the TCP must be wide.

SUMMARY OF THE INVENTION

It is an aspect of the present invention to provide an Organic Light Emitting Display (OLED) capable of assuring a reduced module mounting space by reducing the number of input pins of a driver IC by connecting ground input terminals of the driver IC using a metal cap.

Further, it is another aspect of the present invention to provide an OLED capable of increasing brightness by lowering a ground level of a scan waveform.

To achieve these and other objects of the present invention, an Organic Light Emitting Display (OLED) is provided including: a substrate having defined pixel region and non-pixel regions and including an organic light emitting element arranged in the pixel region; a driver IC arranged in the non-pixel region of the substrate and adapted to supply a signal to the organic light emitting element; a sealant arranged on the non-pixel region of the substrate; a metal cap spaced away from the substrate and affixed with the sealant to a position corresponding to the substrate; a ground wire electrically connecting the driver IC to the metal cap; a conductive paste arranged between the metal cap and the ground wire; and a printed circuit board arranged to correspond to one side of the metal cap.

The OLED preferably further includes a desiccant arranged within the metal cap. The OLED preferably further includes a conductive adhesive member arranged between the metal cap and the printed circuit board and connected to a ground pattern of the printed circuit board. The conductive adhesive member preferably includes a conductive tape.

The conductive paste preferably includes an Ag paste.

The driver IC preferably includes an input terminal and an output terminal, and both sides of an outmost portion of the input terminal preferably include a ground unit.

To achieve these and other objects of the present invention, an Organic Light Emitting Display (OLED) is also provided including: a substrate having defined pixel region and non-pixel regions and including at least one organic light emitting element arranged in the pixel region; a sealant arranged on the non-pixel region of the substrate; a metal cap spaced away from the substrate and affixed with the sealant to positions corresponding to the substrate; Tape Carrier Packages (TCPs) connecting the signal wires of the at least one organic light emitting element on the substrate; driver ICs connected to the TCPs and adapted to supply a signal to the at least one organic light emitting element; ground wires electrically connecting the driver ICs to the metal cap; a conductive paste arranged between the metal cap and the ground wires; and a printed circuit board arranged to correspond to one side of the metal cap.

The driver ICs preferably include scan driver ICs.

An outmost portion of an input terminal of each of the driver ICs is preferably formed with a ground unit electrically connected to one of the ground wires.

The OLED preferably further includes a conductive adhesive member arranged between the metal cap and the printed circuit board and connected to a ground pattern of the printed circuit board. The conductive adhesive member preferably includes a conductive tape. The conductive paste preferably includes an Ag paste. The OLED preferably further includes a desiccant arranged within the metal cap.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 5 is a view of an Organic Light Emitting Display (OLED) according to another embodiment of the present invention; and FIG. 6 is a cross-sectional view taken along line (II-II') of FIG. 5.

DETAILED DESCRIPTION OF THE INVENTION

Hereinafter, exemplary embodiments of the present invention are described with reference to the accompanying drawings.

The following embodiments have been provided for those skilled in the art to fully appreciate the present invention and can be changed in several forms, and therefore the scope of the present invention is not limited to the following described embodiments.

Figure 1:
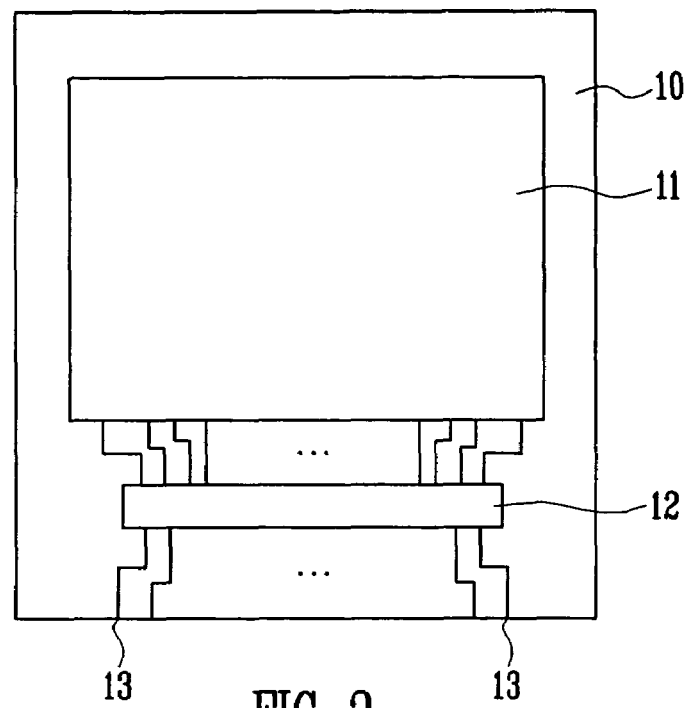
FIG. 1 is a view of an Organic Light Emitting Display (OLED) according to a COG structure of the related art.
Figure 2:
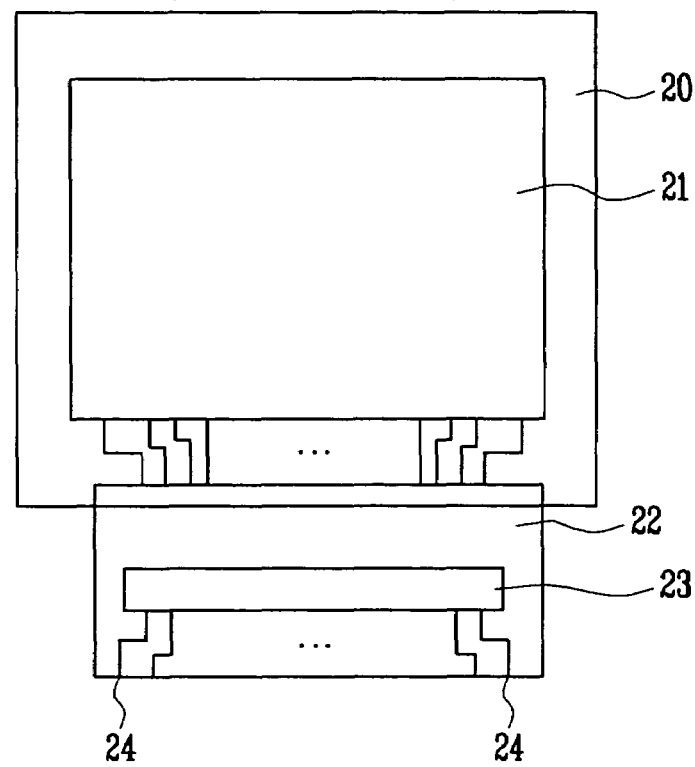
FIG. 2 is a view of an Organic Light Emitting Display (OLED) according to a TCP structure of the related art.
Figure 3:
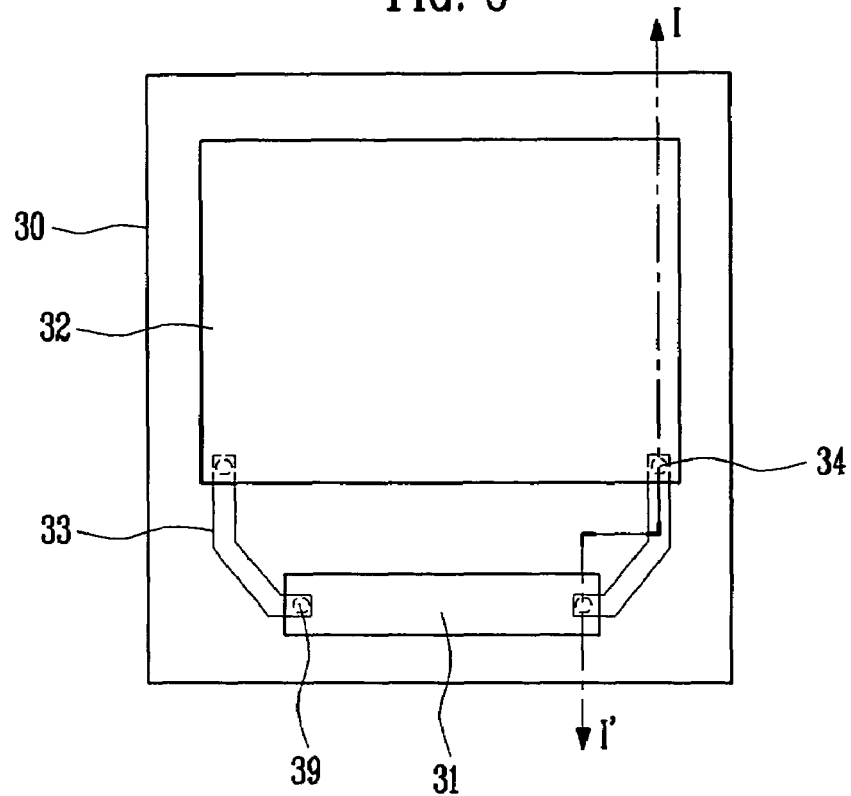
FIG. 3 is a view of an Organic Light Emitting Display (OLED) according to one embodiment of the present invention.
Figure 4:
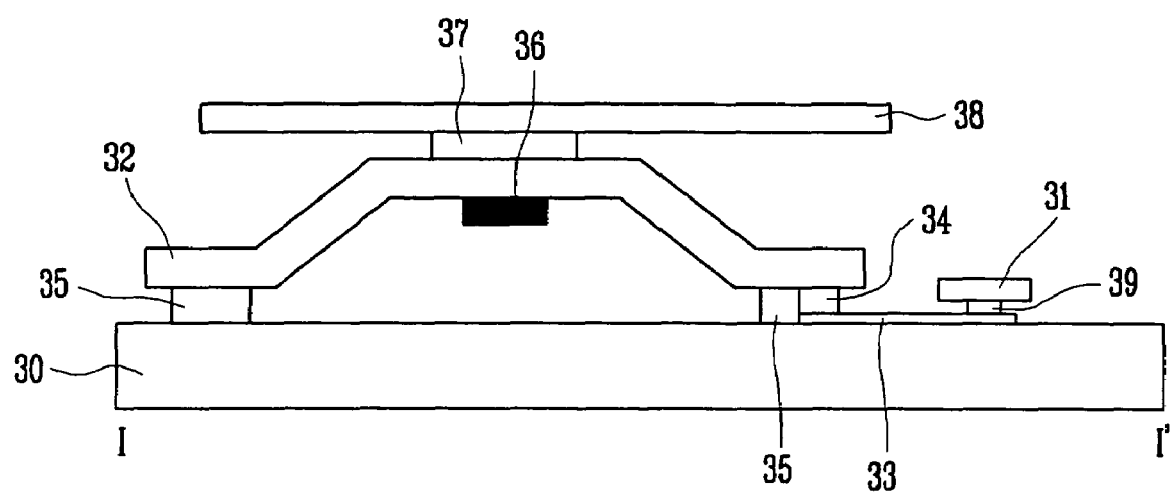
FIG. 4 is a cross-sectional view taken along line (I-I') of FIG. 3.

FIG. 3 is a view of an OLED according to one embodiment of the present invention and FIG. 4 is a cross-sectional view taken along line (I-I') of FIG. 3.

However, in the embodiment of FIG. 3 and FIG. 4, the driver IC is implemented by one chip and consists of a COG structure, which is directly formed on the substrate.

Referring to FIG. 3 and FIG. 4, the OLED according to one embodiment of the present invention includes a substrate 30 having defined pixel and non-pixel regions and including an organic light emitting element that is formed in the pixel region; a driver IC 31 formed in the non-pixel region of the substrate to supply a signal to the organic light emitting element; a sealant 35 applied on the non-pixel region of the substrate 30; a metal cap 32 spaced away from the substrate 30 by a predetermined interval and attached to a position corresponding to the substrate 30 with the sealant; a ground wire 33 connecting the driver IC 31 to the metal cap 32; a conductive paste 34 composed of conductive substances arranged between the metal cap 32 and the ground wire 33; and a printed circuit board 38 arranged to correspond to one side of the metal cap 32.

Also, the inside of the metal cap 32 is further provided with a desiccant 36. The desiccant 36 eliminates moisture and is contained within an oxygen permeable capsule affixed to a portion of the metal cap 32.

The pixel region of the substrate 30 is formed with a plurality of light emitting elements connected between scan lines and data lines in a matrix scheme. Each light emitting element has an anode electrode and a cathode electrode, and has an organic thin film layer formed between the II anode electrode and the cathode electrode and includes a hole transport layer, an organic emission layer and an electron transport layer.

The driver IC 31 is formed in the non-pixel region of the substrate 31 and supplies a signal to the organic light emitting element. Since the driver IC 31 does not have a ground pin, the number of input pins is reduced, thereby easily performing a module mounting.

The driver IC functions to respectively provide scan signals and a data signals to a plurality of scan lines and a plurality of data lines formed in the pixel region.

That is, the inside of the driver IC is provided with a scan driver and a data driver on one chip.

The metal cap 32 is spaced away from the substrate 30 by a predetermined interval and is arranged in a position corresponding to the substrate 30.

The metal cap 32 is provided to prevent the degradation of electrical and emission properties caused by the organic light emitting element formed in the pixel region of the substrate 30 being vulnerable to hydrogen and oxygen from included organic matter and the cathode electrode composed of metal materials that are easily oxidized by moisture in air. The metal cap is configured as a vessel manufactured in the form of a cap of metal materials.

Also, the desiccant 36 is contained within the metal cap 32 in a powder form or is adhered to the inside the metal cap 32 in a film form, eliminating moisture, oxygen and hydrogen permeated from various sources.

The metal cap 32 overlaps both the pixel and non-pixel regions of the substrate 30. The sealant 35 is formed along the periphery of the metal cap 32 corresponding to the non-pixel region of the substrate 30 to seal it.

That is, the substrate 30 is bonded by the sealant 35 to the metal cap 32 having the desiccant 36, resulting in a completed capsulated organic light emitting element.

The ground wire 33 is formed in the non-pixel region of the substrate 30 to connect the driver IC 31 to the metal cap 32. That is, a separate ground unit 39 is formed on both sides of the outmost portion of the input terminal, instead of the ground pin that is not formed in the driver IC 31.

A conductive paste 34 is arranged between the metal cap 32 and the ground wire 33 to electrically connect them. An Ag paste can be utilized as the conductive paste 34.

The printed circuit board 38 is arranged to correspond to one side of the metal cap 32 so that it is electrically connected to the metal cap. That is, the one side of the printed circuit board 38 connected to the metal cap 32 is formed with a ground pattern and a conductive adhesive member 37 is formed between the ground pattern of the printed circuit board 38 and the metal cap 32.

That is, the ground pattern of the printed circuit board 38 is electrically connected to the metal cap 32 through the conductive adhesive member 37.

The conductive adhesive member 37 can be coated and formed with a conductive tape or other conductive substances.

As a result, the ground connection of the driver IC 31 is made through the ground connection wire 33, the conductive paste 34, the metal cap 32, the conductive adhesive member 37, and the ground pattern of the printed circuit board 38.

That is, according to the embodiment of the present invention of FIG. 3 and FIG. 4, the number of the input pins of the driver IC is reduced, thereby assuring a reduced module mounting space.

FIG. 5 is a view of an OLED according to another embodiment of the present invention and FIG. 6 is a cross-sectional view taken along line (II-II') of FIG. 5.

In the embodiment FIG. 5 and FIG. 6, the driver IC is implemented by two chips and consists of a TCP structure, which directly is formed on the substrate.

Referring to FIG. 5 and FIG. 6, the OLED according to another embodiment of the present invention includes: a substrate 40 having defined pixel and non-pixel regions and including at least one an organic light emitting element that is formed in the pixel region; a sealant 49 applied to the non-pixel region of the substrate 40; a metal cap 41 spaced away from the substrate 40 by a predetermined interval and attached to a position corresponding to the substrate 49 with the sealant; TCPs 42 and 43 connecting the signal wires of the organic light emitting element on the substrate 40; driver ICs 44 and 45 connected to the TCPs 42 and 43 to supply a signal to the organic light emitting element; ground wires 46a and 46b connecting the driver ICs 44 and 45 to the metal cap 41; a conductive paste 47 composed of conductive substances and arranged between the metal cap 41 and the ground wire 46; and a printed circuit board 52 arranged to correspond to one side of the metal cap 41.

Also, the inside of the metal cap 41 is further provided with a desiccant 50. The desiccant 50 is to eliminate moisture and oxygen and is contained within a permeable capsule affixed to a portion of the metal cap 41.

The pixel region of the substrate 40 is formed with a plurality of light emitting elements connected between scan lines and data lines in a matrix scheme. The light emitting element includes an anode electrode and a cathode electrode, and an organic thin film layer is formed between the anode electrode and the cathode electrode and includes a hole transport layer, an organic emission layer and an electron transport layer.

The driver ICs 44 and 45 include a data driver IC 44 supplying a data signal and a scan driver IC 45 supplying a scan signal.

The data and scan driver ICs 44 and 45 are respectively connected to the TCP 42 of the side of the data driver and the TCP 43 of the side of the scan driver and the data driver IC 44 and the scan driver IC 45 respectively supply the data signal and the scan signal to the organic light emitting element.

Furthermore, as shown in FIG. 5, the Tape Carrier Package (TCP) has a signal wire connected to the periphery of the substrate 40 to supply a signal to the organic light emitting element.

Since the input terminal of the scan driver IC 41 does not have a ground pin, the number of input pins is reduced, thereby easily performing a module mounting.

A ground unit 48 is directly formed at the input terminal of the scan driver IC 45, instead of using a ground pin.

The metal cap 41 is spaced away from the substrate 40 by a predetermined interval and is arranged in a position corresponding to the substrate 40.

The metal cap 41 is provided to prevent the degradation of electrical and emission properties caused by the organic light emitting element formed in the pixel region of the substrate 40 being vulnerable to hydrogen and oxygen from included organic matter and the cathode electrode composed of metal materials that are easily oxidized by moisture in air. The metal cap is configured as a vessel manufactured in the form of a cap of metal materials.

Also, the desiccant 50 is contained within the metal cap 41 in a powder form or is adhered to the inside the metal cap 32 in a film form, eliminating moisture, oxygen and hydrogen.

The metal cap 41 overlaps the pixel and non-pixel regions of the substrate 40. The sealant 35 is formed along the periphery of the metal cap 41 corresponding to the non-pixel region of the substrate 40 to seal it.

That is, the substrate 40 is bonded by the sealant 35 to the metal cap 41 having the desiccant 50, resulting in a completed capsulated organic light emitting element.

The ground wires 46a and 46b are wires connecting the scan driver IC 25 to the metal cap 41 and are formed on the TCP 43 of the side of the scan driver. That is, they are connected to the ground unit 48 of the scan driver IC, instead of using a ground pin that is not formed in the scan driver IC 45.

The conductive paste 47 is arranged between the metal cap 41 and the ground wire 46a to electrically connect them. An Ag paste can be used as the conductive paste 47.

Also, the printed circuit board 52 is arranged to correspond to one side of the metal cap 41 so that it is electrically connected to the metal cap. That is, the one side of the printed circuit board 52 connected to the metal cap 41 is formed with a ground pattern and a conductive adhesive member 51 is formed between the ground pattern of the printed circuit board 52 and the metal cap 41. That is, the ground pattern of the printed circuit board 52 is electrically connected to the metal cap 41 through the conductive adhesive member 51.

The conductive adhesive member 51 can be coated and formed by a conductive tape or other conductive substances.

As a result, the ground connection of the scan driver IC 45 is made through the ground connection wires 46a and 46b, the conductive paste 47, the metal cap 41, the conductive adhesive member 51, and the ground pattern of the printed circuit board 52.

Since the 2-chip OLED forms a ground terminal separately, the number of input pins of the driver IC can be reduced.

Furthermore, with the construction according to the embodiments of the present invention, the present invention can implement a superior image quality by lowering a ground level depending on reducing a potential difference due to a low wire resistance in a scan waveform.

That is, according to the embodiments of the present invention, the present invention can assure a reduced module mounting space by reducing the number of input pins of a driver IC by connecting ground input terminals of the driver IC using a metal cap and implement a superior image quality by lowering a ground level depending on reducing a potential difference due to a low wire resistance in a scan waveform of a scan driver IC.

Although exemplary embodiments of the present invention have been shown and described, it is apparent to those skilled in the art that modifications can be made to these embodiments without departing from the principles and spirit of the present invention whose scope is defined by the following claims.

What is claimed is:

1. An Organic Light Emitting Display (OLED) comprising:
   a substrate having defined pixel region and non-pixel regions and including an organic light emitting element arranged in the pixel region;
   a driver IC arranged in the non-pixel region of the substrate and adapted to supply a signal to the organic light emitting element;
   a sealant arranged on the non-pixel region of the substrate;
   a metal cap spaced away from the substrate and affixed with the sealant to a position corresponding to the substrate;
   a ground wire electrically connecting the driver IC to the metal cap;
   a conductive paste arranged between the metal cap and the ground wire; and a printed circuit board arranged to correspond to one side of the metal cap.

2. The OLED as claimed in claim 1, further comprising a desiccant arranged within the metal cap.

3. The OLED as claimed in claim 1, further comprising a conductive adhesive member arranged between the metal cap and the printed circuit board and connected to a ground pattern of the printed circuit board.

4. The OLED as claimed in claim 3, wherein the conductive adhesive member comprises a conductive tape.

5. The OLED as claimed in claim 1, wherein the conductive paste comprises an Ag paste.

6. The OLED as claimed in claim 1, wherein the driver IC includes an input terminal and an output terminal, and wherein both sides of an outermost portion of the input terminal include a ground unit.

7. An Organic Light Emitting Display (OLED) comprising:
- a substrate having defined pixel region and non-pixel regions and including at least one organic light emitting element arranged in the pixel region;
- a sealant arranged on the non-pixel region of the substrate;
- a metal cap spaced away from the substrate and affixed with the sealant to positions corresponding to the substrate;
- Tape Carrier Packages (TCPs) connecting the signal wires of the at least one organic light emitting element on the substrate;
- driver ICs connected to the TCPs and adapted to supply a signal to the at least one organic light emitting element;
- ground wires electrically connecting the driver ICs to the metal cap;
- a conductive paste arranged between the metal cap and the ground wires; and
- a printed circuit board arranged to correspond to one side of the metal cap.

8. The OLED as claimed in claim 7, wherein the driver ICs comprise scan driver ICs.

9. The OLED as claimed in claim 7, wherein an outmost portion of an input terminal of each of the driver ICs includes a ground unit electrically connected to one of the ground wires.

10. The OLED as claimed in claim 7, further comprising a conductive adhesive member arranged between the metal cap and the printed circuit board and connected to a ground pattern of the printed circuit board.

11. The OLED as claimed in claim 10, wherein the conductive adhesive member comprises a conductive tape.

12. The OLED as claimed in claim 7, wherein the conductive paste comprises an Ag paste.

13. The OLED as claimed in claim 7, further comprising a desiccant arranged within the metal cap.

14. An Organic Light Emitting Display (OLED) comprising:
- a substrate having defined pixel region and non-pixel regions and including at least one organic light emitting element arranged in the pixel region;
- a sealant arranged on the non-pixel region of the substrate;
- a metal cap spaced away from the substrate and affixed with the sealant to positions corresponding to the substrate;
- driver ICs connected to supply a signal to the at least one organic light emitting element;
- a ground wire electrically connecting the driver ICs to the metal cap;
- a conductive paste arranged between the metal cap and the ground wires; and
- a printed circuit board arranged to correspond to one side of the metal cap.

15. The OLED as claimed in claim 14, further comprising:
- Tape Carrier Packages (TCPs) connecting a plurality of signal wires to the at least one organic light emitting element on the substrate; and
- the driver ICs connected to the TCPs and adapted to supply the signal to the at least one organic light emitting element.

16. The OLED as claimed in claim 14, further comprising a desiccant arranged within the metal cap.

17. The OLED as claimed in claim 14, further comprising a conductive adhesive member arranged between the metal cap and the printed circuit board and connected to a ground pattern of the printed circuit board.

18. The OLED as claimed in claim 17, wherein the conductive adhesive member comprises a conductive tape.

19. The OLED as claimed in claim 14, wherein an outmost portion of an input terminal of each of the driver ICs includes a ground unit electrically connected to the ground wire.

20. The OLED as claimed in claim 14, wherein the driver IC includes an input terminal and an output terminal, and wherein both sides of an outmost portion of the input terminal include a ground unit.

* * * * *

UNITED STATES PATENT AND TRADEMARK OFFICE
CERTIFICATE OF CORRECTION

PATENT NO. : 7,538,343 B2 Page 1 of 1
APPLICATION NO. : 11/582370
DATED : May 26, 2009
INVENTOR(S) : Wi-Jin Nam It is certified that error appears in the above-identified patent and that said Letters Patent is hereby corrected as shown below:

Title Page

Item (73) Assignee:

Please correct

"Samsung Mobil Display Co., Ltd."

To: -- Samsung Mobile Display Co., Ltd. --

Signed and Sealed this

Thirteenth Day of July, 2010

David J. Kappos
*Director of the United States Patent and Trademark Office*